United States Patent [19]

Young

[11] Patent Number: 4,712,674
[45] Date of Patent: * Dec. 15, 1987

[54] CONTAINER FOR STATIC-SENSITIVE ARTICLES

[75] Inventor: William I. Young, North Situate, Mass.

[73] Assignee: Hy-Con Products, Inc., Framingham, Mass.

[*] Notice: The portion of the term of this patent subsequent to Sep. 9, 2003 has been disclaimed.

[21] Appl. No.: 860,499

[22] Filed: May 7, 1986

Related U.S. Application Data

[63] Continuation of Ser. No. 715,203, Mar. 25, 1985, Pat. No. 4,610,353.

[51] Int. Cl.$^4$ .............................................. B65D 73/02
[52] U.S. Cl. ................................... 206/328; 206/522; 206/334; 428/924
[58] Field of Search ...................... 206/328, 522, 334; 428/924; 361/212, 220

[56] References Cited

U.S. PATENT DOCUMENTS

| | | |
|---|---|---|
| 1,597,450 | 4/1926 | Lewton . |
| 2,274,712 | 2/1942 | Kroner . |
| 2,534,201 | 12/1950 | Hutter . |
| 3,273,779 | 9/1966 | Mykleby . |
| 3,572,499 | 3/1971 | Mondale . |
| 3,671,806 | 6/1972 | Whitmore . |
| 3,774,757 | 11/1973 | Harris . |
| 3,993,827 | 11/1976 | Dukert . |
| 4,037,267 | 7/1977 | Kisor . |
| 4,038,693 | 7/1977 | Huffine . |
| 4,084,210 | 4/1978 | Forrest . |
| 4,160,503 | 7/1979 | Ohlbach . |
| 4,211,324 | 7/1980 | Ohlbach . |
| 4,223,368 | 9/1980 | Dattilo . |
| 4,238,030 | 12/1980 | Maylandt ............................ 206/328 |
| 4,241,829 | 12/1980 | Hardy ................................. 206/328 |
| 4,247,002 | 1/1981 | Horian . |
| 4,293,070 | 10/1981 | Ohlbach ............................. 206/328 |
| 4,482,048 | 11/1984 | Blodgett ............................. 206/328 |

OTHER PUBLICATIONS

Insulation Circuits Magazine, Mar. 1980, pp. 20–41.
Passive Static Protection, George Berbeco, (1980), 12 pages.
Westcorp, 1981, 1 page; 1984, 1 page.
Sentinel Folder, 1984, 2 pages.
Sentinel-Series 500, (1984), Bulletins 501–514.
Letter, Jun. 11, 1985—Bosie-Cascade, Price List, Jan. 1, 1984—Bosie-Cascade.
Letter, Apr. 19, 1985—Bosie-Cascade, Data Sheet—Boise-Cascade.

*Primary Examiner*—Joseph Man-Fu Moy
*Attorney, Agent, or Firm*—Blodgett & Blodgett

[57] ABSTRACT

Container having walls in the form of corrugated board in which an electrically-conductive layer of carbon particles is dispersed through the webs and flute before the corrugated board is assembled.

5 Claims, 4 Drawing Figures

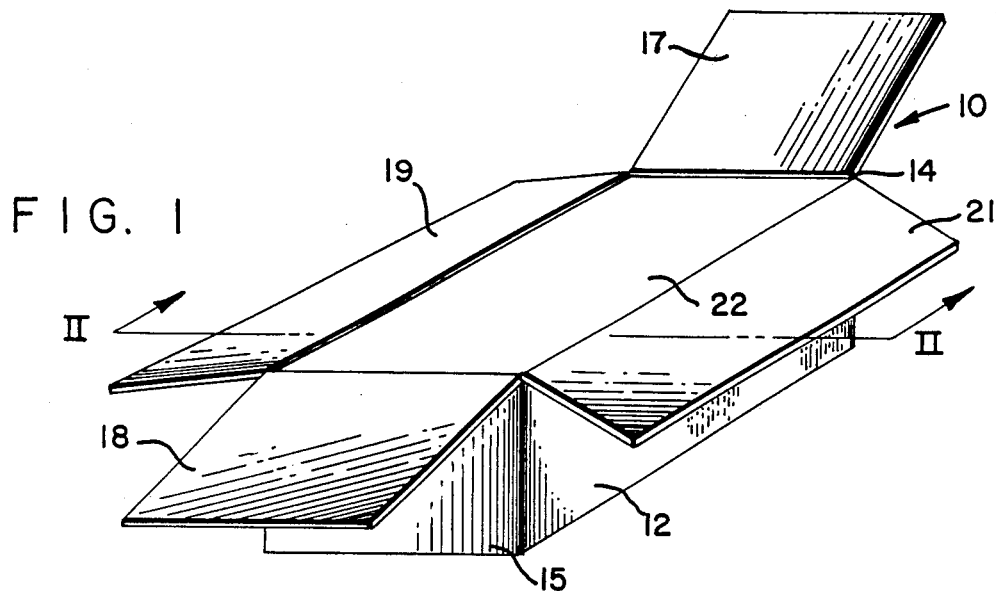
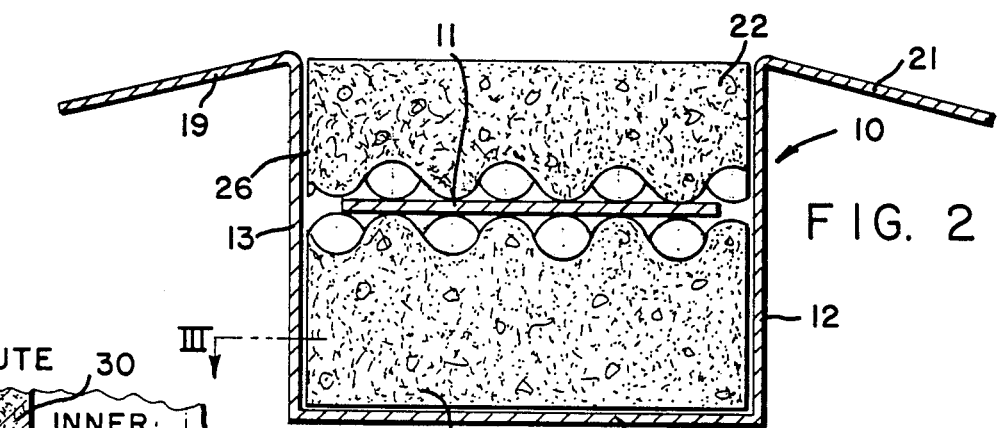
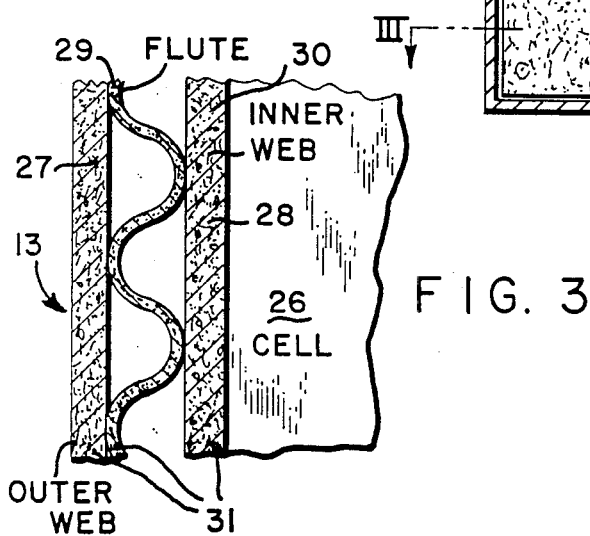
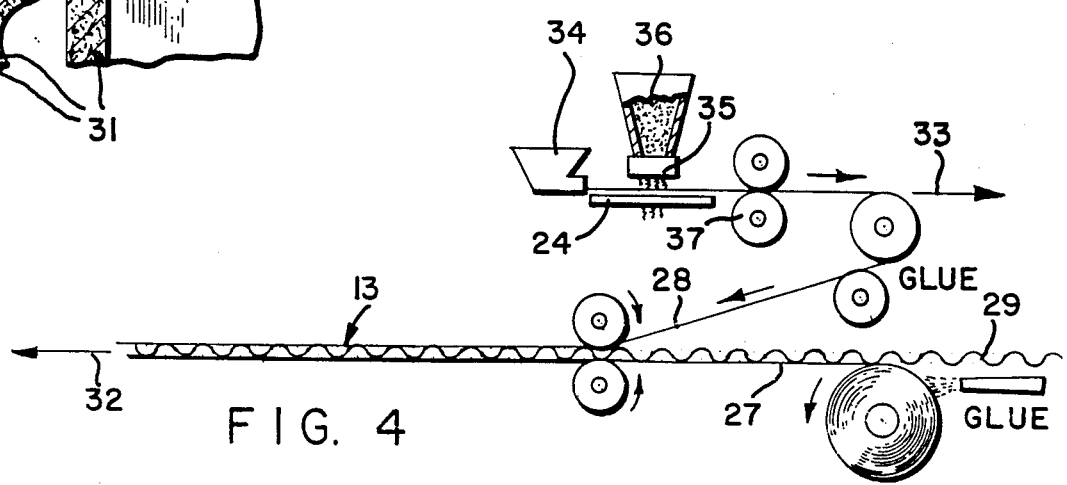

CONTAINER FOR STATIC-SENSITIVE ARTICLES

This is a continuation of co-pending application Ser. No. 715,203 filed on Mar. 25, 1985, now U.S. Pat. No. 4,610,353.

BACKGROUND OF THE INVENTION

In the recent past, industry has been faced with the problem presented by the sensitivity of modern electronic circuits to static electricity. This is particularly true of printed circuit boards and the like that use integrated circuits. These circuits can be completely destroyed by being subjected to static electricity. As is well known, such static electricity can reach 20,000 volts in the common situation of a human being walking across a carpeted room. It is, therefore, important that containers or packages be provided to retain these static-sensitive articles in such a way that they are insulated against such static electricity. For this purpose, a number of techniques have been used, usually involving layers of conductive materials, such as foil and the like, that are incorporated into the packages to surround the articles, so that the static electricity is drained away. In order to maintain the cost of such containers at a low value, it has become common practice to use carbon layers for this purpose, the carbon layer being printed on the material from which the container is made. Since corrugated board is the material from which most inexpensive containers are made, it has become common practice to coat a surface of the board with the carbon layer. There are a number of difficulties experienced with that process, one of which is that the carbon layer would normally be applied in the factory which makes the corrugated board. The corrugated board is then shipped to a converter who makes it into various types of containers. It can be seen, then, that the handling of the board between the manufacturing plant and the converters plant could result in destruction of this layer of carbon. Also, because the board is not conductive from one side to the other, there are junctions of board pieces that are mechanically closed, but are not electrically closed, so that the effectiveness of the container as a Faraday Cage is reduced. These and other difficulties experienced with the prior art devices have been obviated in a novel manner by the present invention.

It is, therefore, an outstanding object of the invention to provide a container for static-sensitive articles in which a static barrier is incorporated in a corrugated board wall.

Another object of this invention is the provision of a container having a static barrier in which particles of carbon are dispersed throughout the materials from which the container is made.

A further object of the present invention is the provision of a corrugated board for a static-shielded container, which board has carbon uniformly dispersed throughout its parts, so that the box can form a closed Faraday Cage.

It is another object of the instant invention to provide a container for use with static-sensitive articles which is simple in construction, which is inexpensive to manufacture, and which is capable of extensive use without damage or deterioration of the static electricity shielding capability.

With these and other objects in view, as will be apparent to those skilled in the art, the invention resides in the combination of parts set forth in the specification and covered by the claims appended hereto.

SUMMARY OF THE INVENTION

In general, the invention consists of a container for use with an article which can be damaged by static electricity, the container having a plurality of walls forming a cell in which the article resides. Each wall consists of a sheet of corrugated board made up of an outer web located outside of the cell, an inner web located inside the cell, and a corrugated flute sandwiched between the inner and outer webs. Both the webs and the flute are formed of paper having high bulk conductivity due to uniform dispersion of carbon throughout the paper. The container is also lined with conductive foamed plastic.

More specifically, the carbon consists of carbon particles impregnated substantially throughout the paper so that the paper and board have high surface and bulk conductivity. The process for forming the board involves either adding high concentration of carbon particles to the flow box of the Fourdrinier machine, pouring a dilute aqueous suspension of carbon particles through the pulp on the Fourdrinier screen, or mixing the carbon to the pulp prior to its application to the screen. In any case, the application must be such as to achieve substantial break-through and homogeneity of the carbon in the pulp.

BRIEF DESCRIPTION OF THE DRAWINGS

The character of the invention, however, may be best understood by reference to one of its structural forms as illustrated by the accompanying drawings, in which:

FIG. 1 is a perspective view of a container embodying the principles of the present invention, FIG. 2 is a vertical sectional view of the container taken on the line II—II of FIG. 1, FIG. 3 is an enlarged sectional view of a portion of the container taken on the line III—III of FIG. 2, and FIG. 4 is a schematic view of apparatus for carrying out a process forming part of the present invention.

DESCRIPTION OF THE PREFERRED EMBODIMENT

Referring first to FIGS. 1 and 2, which show the general features of the invention, it can be seen that the container, indicated generally by the reference numeral 10, is intended for use in the storage and transportation an article 11 which can be damaged by static electricity. The article can, for instance, be an integrated circuit chip, such chips being notorious for being easily damaged by receiving a static charge. The container consists of two side walls 12 and 13, two end walls 14 and 15, and a bottom wall 16. The top is closed by the use of end flaps 17 and 18, and side flaps 19 and 21. The closed container forms a closed cell 26 which functions as a Faraday Cage. The cell contains foam plastic packing 22 and 23, which is conductive and in the preferred embodiment would be foam polyurethane impregnated with a conductive water-based loading of conductive carbon particles to give a conductivity in the order of $10^7$ ohms/square inch.

Referring next to FIG. 3, which shows the details of a typical wall 13, it can be that the sheet of corrugated board is made up of an outer web 27 located outside of the cell 26, an inner web 28 facing into the cell 26, and a corrugated flute 29 that is sandwiched between the inner and outer webs. The board elements are formed of kraft paper containing a substantially uniform dispersion of conductive carbon particles 30, so that the board has a high bulk conductivity from the outer surface of web 27 to the inner surface of web 28, and forms a carbon barrier or layer 31 that is continuous when the box is closed.

In the preferred embodiment, the carbon layer 31 consists of carbon particles that are impregnated into the paper before the layer and the board are formed. The carbon is present to a high level, so that the board has a surface and bulk conductivity in the range from $10^3$ ohm/sq. in. to $10^9$ ohm/sq. in.

FIG. 4 illustrates a process for forming the corrugated board, the wall 13 being typical. The process of FIG. 4 shows the forming of a corrugated board 13. It is intended for use in fabricating a container 10 for a static-sensitive article 11. The elements 27, 28, and 29 are all formed in the same manner, so that they have a substantially uniform dispersion of carbon particles rendering them highly conductive. For example, web 28 is formed by pouring liquid paper pulp from a flow box 34, to the screen 24 of a Fourdrinier machine. While the pulp is still in a highly-liquid form, a highly-dilute agueous suspension 36 of carbon particles is poured onto the pulp from dispenser 35. As the suspension is filtered through the pulp, the carbon is substantially uniformly dispersed through the pulp and resulting paper.

In an alternate method, the carbon could be mixed into the pulp in the flow box 34.

The web 28 is then passed over a heated roll 37 to dry the mix and form the carbon-filled sheet. The inner web 28 is then reversed in direction and passed into the first horizontal path 32 on top of the flute 29. The two webs and the flute are joined to form the corrugated board 13.

The operation and advantages of the present invention will be readily understood in view of the above description. In FIG. 1, it can be seen that the container 10 forms a cell 26, which contains a static-sensitive article, such as a printed circuit or a integrated circuit chip 11 surrounded in conductive foam. After the article and foam are inserted, the flaps 19 and 21 will be folded over the top side of the container and then sealed by use of the end flaps 17 and 18 to provide the cell with six (6) walls, each one of which has the static electricity barrier or carbon layer 31. Since the corrugated board 13, as manufactured, contains the carbon throughout its bulk, each board-to-board intersection forms both a physical and an electrical seal, thereby forming a more perfect Faraday Cage. In addition, once the converter has received the corrugated board and formed the container 10 from it and the container is used, the carbon will not spall off, because it is impregnated into the paper itself rather than merely being an external layer or coating. It is entirely dispersed within the corrugated board and is not as vulnerable to abrasion, breakage, spalling, or the like as a coating would be. In other words, a perfectly reliable barrier against static electricity is provided in the container and there is no opportunity for the conductive layer to be damaged.

At the center of the present invention is the concept of loading the board by impregnation of the pulp with carbon to produce a container whose electrical characteristic is conductive and dissipative. The plastic foam is of the open-cell type that allows it to be impregnated with carbon to a level that is also conductive and dissipative. The result in both cases is the production of a material that is homogeneous and conductive and have no insulating coating that would interfere with the dissipation of any static electrical charge.

In order to understand how packaging materials protect sensitive devices, one of the fundamental concepts that must be understood is the difference between Conductors and Insulators. There is no such thing as a perfect insulator or a perfect conductor.

By definition, an Insulator is a material or substance whose surface resistivity, when measured by an Industry standard test, exceeds $10^{14}$ ohms per square inch. In electrical theory, when the surface resistivity of a material reaches this value, an electron will not move on (or in) the material.

If the surface resistivity is below this value, by definition, the material is called a conductor. At values below $10^{14}$ ohms per square, some materials are very poor conductors while others are extremely good conductors. The lower the surface resistivity of material, the better a conductor it is. Thus a material whose surface resistivity is in the range of $10^{12}$ ohms per square inch is a poor conductor, while a material whose surface resistivity is in the range of $10^3$ ohms per square inch is a good conductor.

Because there is so wide a range in the definition of a conductor, three sub-classifications of conductors have been defined. The following chart indicates these generally-accepted definitions:

| CLASS | VALUE IN OHMS PER SQUARE INCH |
|---|---|
| Insulators | More than $10^{14}$ |
| Anti-Stats | Less than $10^{14}$ but more than $10^9$ |
| Dissipatives | Less than $10^9$ but more than $10^5$ |
| Conductors | Less than $10^5$ |

This subclassification system has led to some confusion because the words CONDUCTIVE and CONDUCTOR have been used interchangeably by people in the Industry. Anti-Stats, Static Dissipatives, and Conductors are all conductive. Only insulators are nonconductive. Too often an engineer or purchasing agent will ask for a conductive material when in fact he or she is looking for a material that is classified as a conductor. This distinction between a conductor and conductive materials becomes very important in the way each functions in providing protection for sensitive devices. The key point is the fact that an electrical charge will move to ground from any conductive material, regardless of whether it is classified as an antistat, a static dissipative, or conductor material. The difference between them is the speed, at which the charge will move to ground.

A charge will not move to ground from an insulator. Once an insulator is charged, will remain charged for a long period of time.

It is obvious that minor changes may be made in the form and construction of the invention without departing from the material spirit thereof. It is not, however, desired to confine the invention to the exact form herein shown and described, but it is desired to include all such as properly come within the scope claimed.

The invention having been thus described, what is claimed as new and desired to secure by Letters Patent is:

1. Container for use with an article which can be damaged by static electricity, comprising:
a plurality of walls forming a cell in which the article resides, each wall consisting of a sheet of corrugated board made up of an outer web, an inner web, and a corrugated flute web that is sandwiched between the inner and outer webs, at least one web being formed with a substantially uniform, electrically-conductive dispersion of conductive particles, wherein the walls have a surface conductivity and bulk conductivity in the range from $10^3$ to $10^9$ ohms/squares, wherein the container contains electrically-conductive foam plastic packing, consisting of a block of electrically-conductive foamed plastic packing enclosed in the container and having a conductivity in the order of $10^7$ ohms/square, wherein the foam plastic is of the open-cell type and is impregnated with carbon particles during its manufacture.

2. Container for use with an article which can be damaged by static electricity, comprising:

a plurality of walls forming a cell in which the article resides, each wall consisting of a sheet of corrugated board made up of an outer web, an inner web, and a corrugated flute web that is sandwiched between the inner and outer webs, at least one web being formed with a substantially uniform, electrically-conductive dispersion of conductive particles, whererin the walls have a surface conductivity and bulk conductivity in the range from $10^3$ to $10^9$ ohms/square, wherein the container contains electrically-conductive foam plastic packing, consisting of a block of electrically-conductive foamed plastic packing enclosed in the container and having a conductivity in the order of $10^7$ ohms/square, wherein the foam plastic is of the open-cell type and is impregnated with carbon particles during its manufacture, and wherein each web has a conductivity of $10^6$ and the foamed plastic is selected from the class consisting of polyethylene and polyurethane.

3. Container for use with an article which can be damaged by static electricity, comprising:
  (a) a plurality of walls forming a cell in which the article resides, each wall consisting of a sheet of board made up of with a substantially uniform, electrically conductive dissipative dispersion of conductive particles dipersed throughout to give a conductivity in the range from $10^3$ to $10^9$ ohms/square inch, and
  (b) a block of electrically-conductive foamed plastic packing enclosed in the container having a conductivity in the order of $10^7$ ohms/square inch.

4. Container as recited in claim 3, where the foam plastic of the open-cell type and is impregnated with the carbon during its manufacture.

5. Container as recited in claim 3, wherein board has a conductivity of $10^6$ and the foamed plastic is selected from the class consisting of polyethylene and polyurethane.

* * * * *